United States Patent
Chen et al.

(10) Patent No.: US 10,128,737 B1
(45) Date of Patent: Nov. 13, 2018

(54) CONSTANT ON-TIME SWITCHING CONVERTER AND CLOCK SYNCHRONIZATION CIRCUIT

(71) Applicant: ANPEC ELECTRONICS CORPORATION, Hsinchu (TW)

(72) Inventors: Chih-Yuan Chen, Hsinchu (TW); Zhan-Zhe Huang, Hsinchu (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 15/718,784

(22) Filed: Sep. 28, 2017

(30) Foreign Application Priority Data

Jul. 5, 2017 (TW) .............................. 106122551 A

(51) Int. Cl.
- G05F 1/00 (2006.01)
- H02M 1/08 (2006.01)
- H03L 7/06 (2006.01)
- H02M 3/156 (2006.01)
- H03K 5/24 (2006.01)

(52) U.S. Cl.
CPC ............. *H02M 1/08* (2013.01); *H02M 3/156* (2013.01); *H03K 5/24* (2013.01); *H03L 7/06* (2013.01)

(58) Field of Classification Search
CPC .................. H02M 3/156; H02M 3/158; H02M 2001/0041; H02M 1/08; H03L 7/06

USPC .......................... 323/282, 283, 284, 285, 288
See application file for complete search history.

(56) References Cited

U.S. PATENT DOCUMENTS

| | | | |
|---|---|---|---|
| 2009/0128116 A1* | 5/2009 | Noda ................... | H02M 3/1588 323/290 |
| 2010/0033215 A1* | 2/2010 | Fogg .................... | H02M 3/156 327/137 |
| 2014/0167723 A1* | 6/2014 | Kuo ..................... | H02M 3/1588 323/283 |
| 2014/0184180 A1* | 7/2014 | Kronmueller ........... | G05F 1/595 323/271 |
| 2015/0162829 A1* | 6/2015 | Chiu ..................... | H02M 3/156 323/271 |
| 2015/0277460 A1* | 10/2015 | Liu ........................... | H03L 7/06 323/280 |
| 2015/0280556 A1* | 10/2015 | Bari ....................... | H02M 3/156 323/282 |
| 2016/0276931 A1* | 9/2016 | Trichy .................. | H02M 3/158 |

* cited by examiner

Primary Examiner — Alex Torres-Rivera
(74) Attorney, Agent, or Firm — Li & Cai Intellectual Property (USA) Office

(57) ABSTRACT

A constant on-time switching converter and a clock synchronization circuit are provided, which generate a synchronization signal according to a clock signal, an input voltage, and an output voltage. The synchronization signal will be synchronized with a period length of the clock signal, thereby acquiring the duty cycle of the constant on-time switching converter. People in the business can accordingly avoid the interference with the synchronization signal and other major clock signals, to prevent electromagnetic interference (BMI) generation.

12 Claims, 5 Drawing Sheets

CONSTANT ON-TIME SWITCHING CONVERTER AND CLOCK SYNCHRONIZATION CIRCUIT

BACKGROUND

1. Technical Field

The present disclosure relates to a switching converter and a clock synchronization circuit, in particular, to a constant on-time switching converter and a clock synchronization circuit which can synchronize a period length of a clock signal, thereby generating a duty cycle of the constant on-time switching converter.

2. Description of Related Art

For the power management in a system, constant on-time switching converters are often used to provide different levels of operating voltage. The constant on-time switching converter has a frequency width modulation (PFM) controller and an output-stage circuit. The PFM controller has an internal pulse generator and the internal pulse generator generates the constant on-time (COT) to control the output-stage circuit to generate a stable output voltage and a wide-ranged output current, thereby efficiently converting the voltage.

Reference is made to FIG. 1 which shows the schematic diagram of a traditional constant on-time switching converter. The switching converter 900 is used for converting the input voltage Vin into the output voltage Vout to drive a load (represented by the capacitor Cp). The switching converter 900 includes an output-stage circuit 920 and a pulse frequency modulation (PFM) controller 910. The output-stage circuit 920 connects the PFM controller 910. The output-stage circuit 920 includes a gate driving circuit 922, an inductor L, a switch circuit 924, and a feedback circuit 926.

The switch circuit 924 includes a high-side switch Sup and a low-side switch Sdn. The high-side switch Sup which is turned on provides a charge path to the inductor L. The low-side switch Sdn which is turned on provides a discharge path to the inductor L. The feedback circuit 926 is used for detecting the variation of the output voltage Vout. More specifically, the feedback circuit 926 divides the output voltage Vout by two series resistors R1 and R2 to generate the corresponding feedback voltage Vfb to the PFM controller 910.

The PFM controller 910 includes an internal clock generator 912 and a decision circuit 914. The decision circuit 914 connects the internal clock generator 912. The decision circuit 914 generates a switch signal SW to the internal clock generator 912 according to the feedback voltage Vfb. The internal clock generator 912 outputs a constant on-time Ton to the gate driving circuit 922 of the output-stage circuit 920 according to the switch signal SW and an internal clock signal generated from the internal clock generator 912 (not shown in FIGs). The gate driving circuit 922 controls the high-side switch Sup and the low-side switch Sdn according to the constant on-time Ton to charge or discharge the inductor L. Therefore, the gate driving circuit 922 generates the necessary load current and the stable output voltage Vout.

However, in the architecture of the conventional switching converter 900, the internal clock signal will vary with the duty cycle and the transient condition of the switching converter 900, so that the switching frequency cannot be a constant frequency. This inconstant switching frequency will generate electromagnetic interference (EMI) and affect other major clock signals.

SUMMARY

Accordingly, exemplary embodiments of the present disclosure provide a constant on-time switching converter and a clock synchronization circuit, which are used to synchronize the switching frequency with the clock signal having a constant period, thereby generating a duty cycle. People in the business can accordingly avoid the interference with the switching frequency and other major clock signals, to prevent EMI generation.

An exemplary embodiment of the present disclosure provides a constant on-time switching converter. The constant on-time switching converter includes an output-stage circuit, a decision circuit, a clock synchronization circuit, and a pulse generator. The output-stage circuit is configured for converting an input voltage into an output voltage according to a constant on-time and is configured for generating a feedback voltage according to the output voltage. The decision circuit is connected to the output-stage circuit and is configured for generating a switch signal. The clock synchronization circuit is connected to the decision circuit and is configured for receiving a constant clock signal, the switch signal, the input voltage and the output voltage. The clock synchronization circuit includes a first detector, a second detector, and a signal synchronization generator. The first detector is configured for generating a first voltage with a period length related to the output voltage and the constant clock signal and generates a reference voltage according to the first voltage. The second detector is configured for generating a second voltage related to the input voltage. The signal synchronization generator is connected to the first detector and the second detector and is configured for comparing the reference voltage with the second voltage to generate a synchronization signal. The synchronization signal synchronizes the period length of the constant clock signal. The pulse generator is connected between the clock synchronization circuit and the output-stage circuit and is configured for generating the constant on-time according to the synchronization signal. After the constant clock signal is a positive-edge trigger, the reference voltage is a high level, the first voltage is converted from the high level into a low level and then increases, and the second voltage is the low level. After the constant clock signal is the positive-edge trigger, when the switch signal is the positive-edge trigger, the synchronization signal is converted from the low level into the high level; the reference voltage is the high level, the first voltage increases and the second voltage increases from the low level. When the second voltage increases to be higher than the reference voltage, the synchronization signal is converted from the high level into the low level and the second voltage is converted from the high level into the low level until the next positive-edge trigger of the switch signal occurs.

An exemplary embodiment of the present disclosure provides a clock synchronization generator. The clock synchronization generator is adapted for a switching converter. The switching converter converts an input voltage into an output voltage according to a constant on-time. The constant on-time is generated according to a synchronization signal. The synchronization signal is related to a switch signal generated from a feedback voltage of the output voltage, the input voltage, the output voltage, and a constant clock signal. The clock synchronization circuit includes a first detector, a second detector, and a signal synchronization generator. The first detector is configured for generating a first voltage with a period length related to the output voltage and the constant clock signal and generates a reference voltage according to the first voltage. The second detector is configured for generating a second voltage related to the input voltage. The signal synchronization generator is connected to the first detector and the second detector and is configured for comparing the reference voltage with the second voltage to generate the synchronization signal. The synchronization signal synchronizes the period length of the constant clock signal. After the constant clock signal is a positive-edge trigger, the reference voltage is a high level, the first voltage is converted from the high level into a low level and then increases, and the second voltage is the low level. After the constant clock signal is the positive-edge trigger, when the switch signal is the positive-edge trigger, the synchronization signal is converted from the low level into the high level; the reference voltage is the high level, the first voltage increases and the second voltage increases from the low level. When the second voltage increases to be higher than the reference voltage, the synchronization signal is converted from the high level into the low level and the second voltage is converted from the high level into the low level until the next positive-edge trigger of the switch signal occurs.

In order to further understand the techniques, means and effects of the present disclosure, the following detailed descriptions and appended drawings are hereby referred to, such that, and through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

Figure 1:
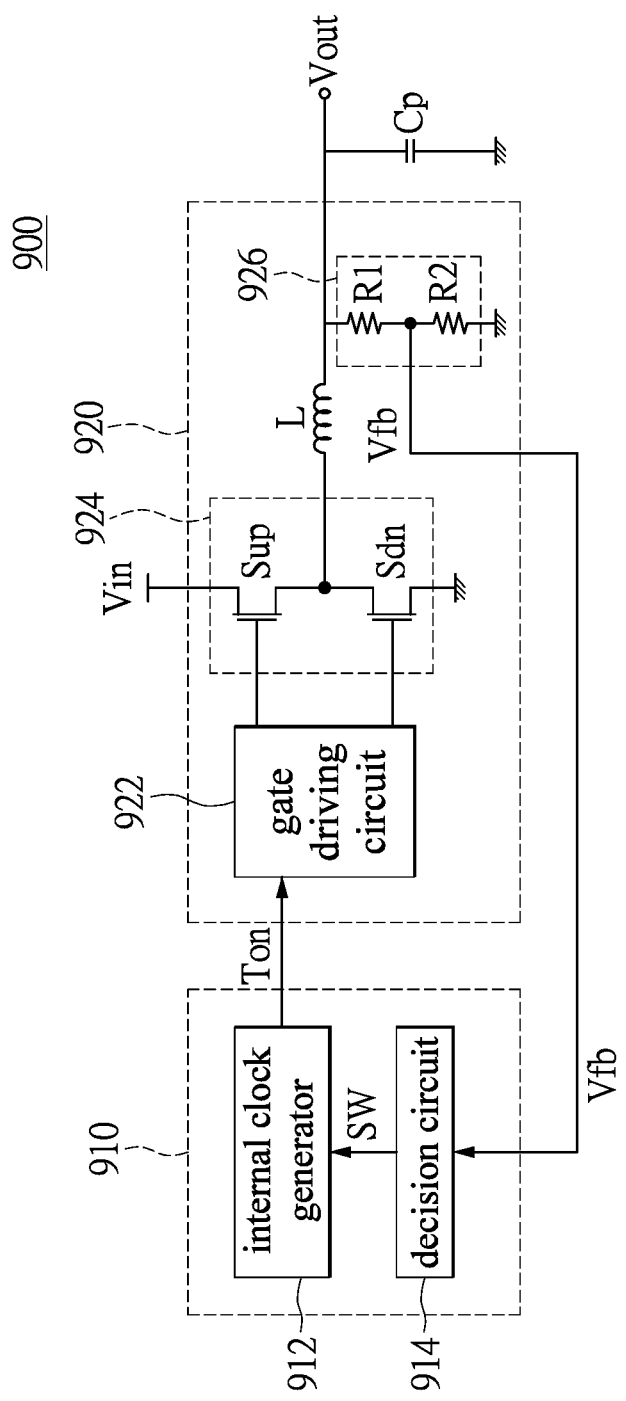
FIG. 1 shows a schematic diagram of a conventional constant on-time switching converter.

Reference will now be made in detail to the exemplary embodiments of the present disclosure, examples of which are illustrated in the accompanying drawings. Wherever possible, the same reference numbers are used in the drawings and the description to refer to the same or like parts.

The present disclosure provides a constant on-time switching converter and a clock synchronization circuit, which can generate a synchronization signal according to a switch signal (related to a feedback signal), a constant clock signal (having a constant period), an input voltage, and an output voltage, thereby synchronizing the synchronization signal with the constant clock signal having the constant period and generating a duty cycle. People in the business can accordingly avoid the interference with the synchronization signal and other major clock signals, to prevent EMI generation. The constant on-time switching converter and the clock synchronization circuit provided in the exemplary embodiment of the present disclosure will be described in the following paragraphs.

Figure 2:
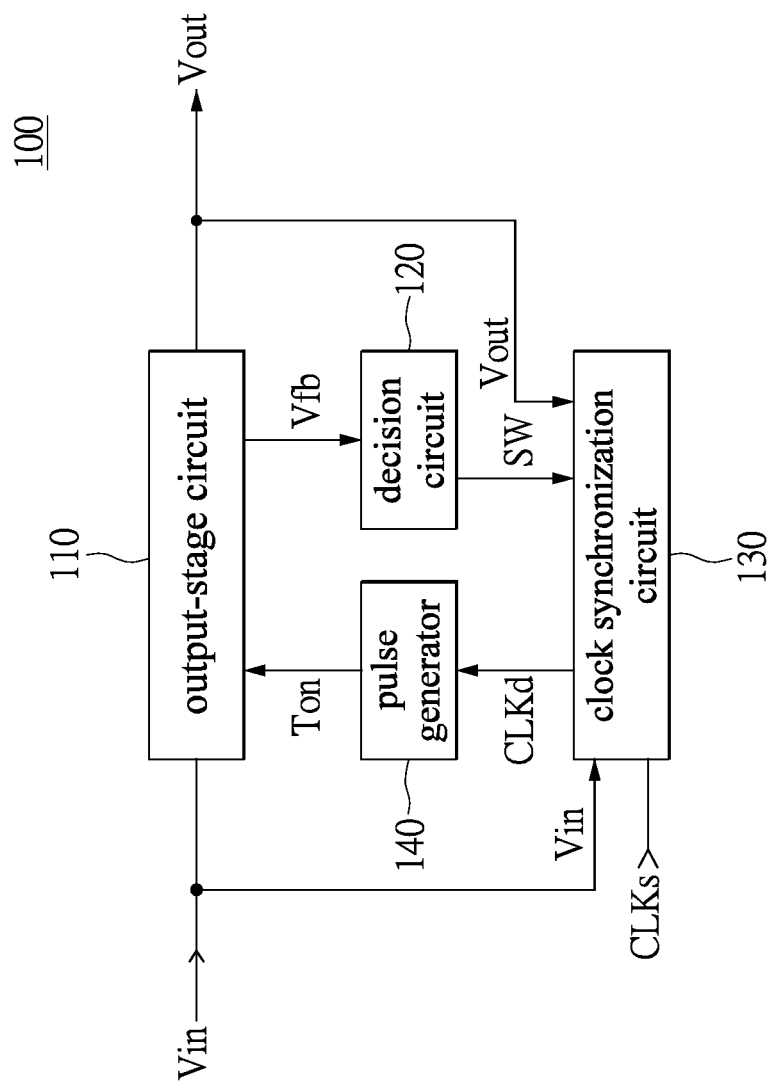
FIG. 2 shows a schematic diagram of a constant on-time switching converter according to an embodiment of the present disclosure.

Reference is first made to FIG. 2, which shows a schematic diagram of a constant on-time switching converter according to an embodiment of the present disclosure. As shown in FIG. 2, the constant on-time switching converter 100 is used for converting an input voltage Vin into an output voltage Vout to drive a load. The switching converter 100 includes an output-stage circuit 110, a decision circuit 120, a clock synchronization circuit 130, and a pulse generator 140. The output-stage circuit 110 converts the input voltage Vin into the output voltage Vout according to a constant on-time Ton and generates a feedback voltage Vfb to the decision circuit 120 according to the output voltage Vout.

The decision circuit 120 connects to the output-stage circuit 110 and the clock synchronization circuit 130. The decision circuit 120 generates the switch signal SW to the clock synchronization circuit 130 according to the feedback voltage Vfb. The clock synchronization circuit 130 receives a constant clock signal CLKs, the switch signal SW, the input voltage Vin, and the output voltage Vout to generate a synchronization signal CLKd. The pulse generator 140 connects to the output-stage circuit 110 and the clock synchronization circuit 130 and generates the constant on-time Ton to the output-stage circuit 110 according to the synchronization signal CLKd.

Implementations with respect to the output-stage circuit 110 converting the input voltage Vin into the output voltage Vout according to the constant on-time Ton are the same as that of the conventional switching converter 900 shown in FIG. 1, so detailed description is omitted. The difference is that user additionally configures the clock synchronization circuit 130 to synchronize the synchronization signal CLKd with the period length of the constant clock signal CLKs and to generate the constant on-time Ton according to the synchronization signal CLKd, thereby acquiring the period length of the synchronization signal CLKd and the duty cycle of the switching converter 100.

Figure 3:
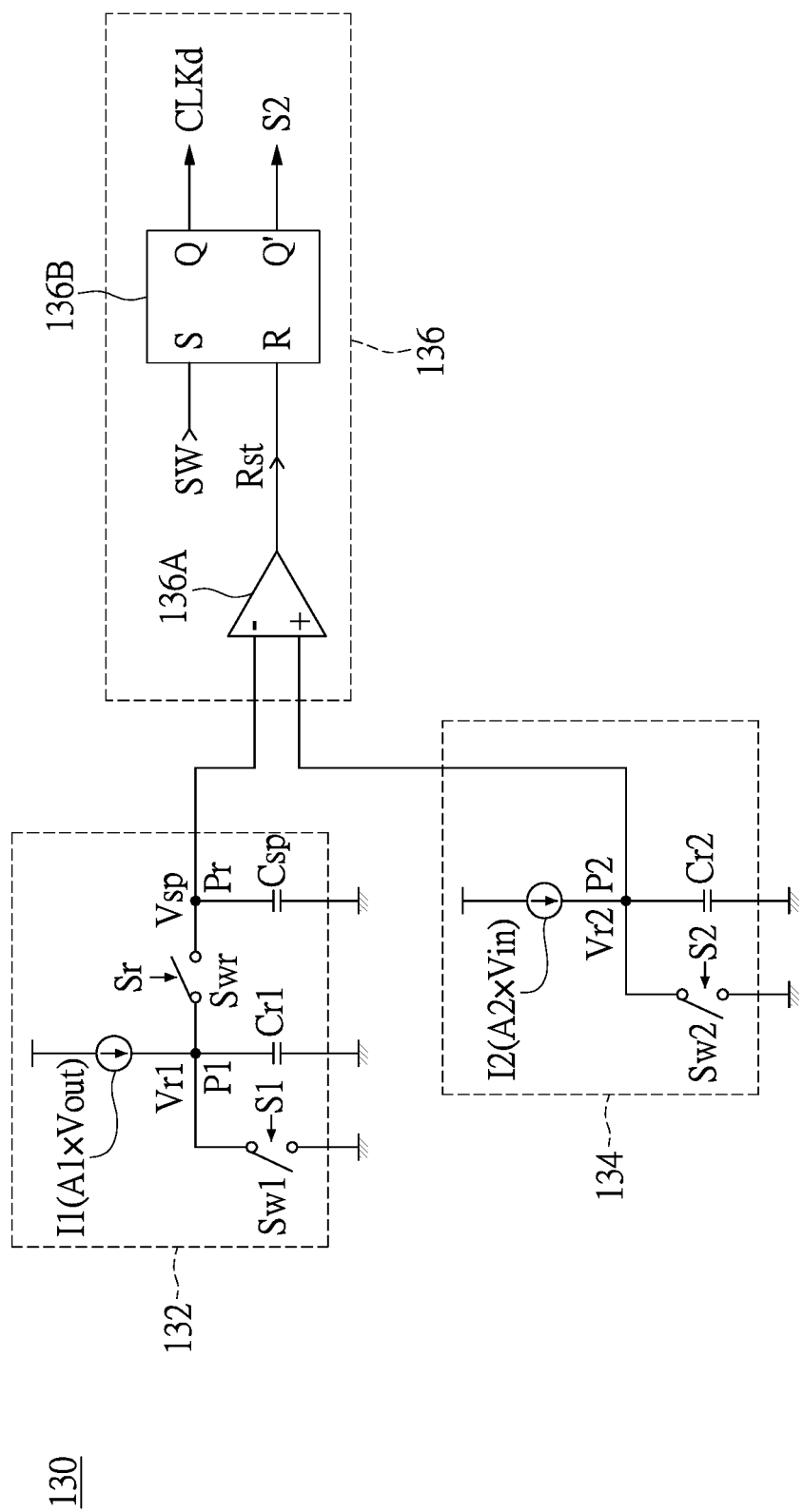
FIG. 3 shows a schematic diagram of a clock synchronization circuit according to an embodiment of the present disclosure.
Figure 4A:
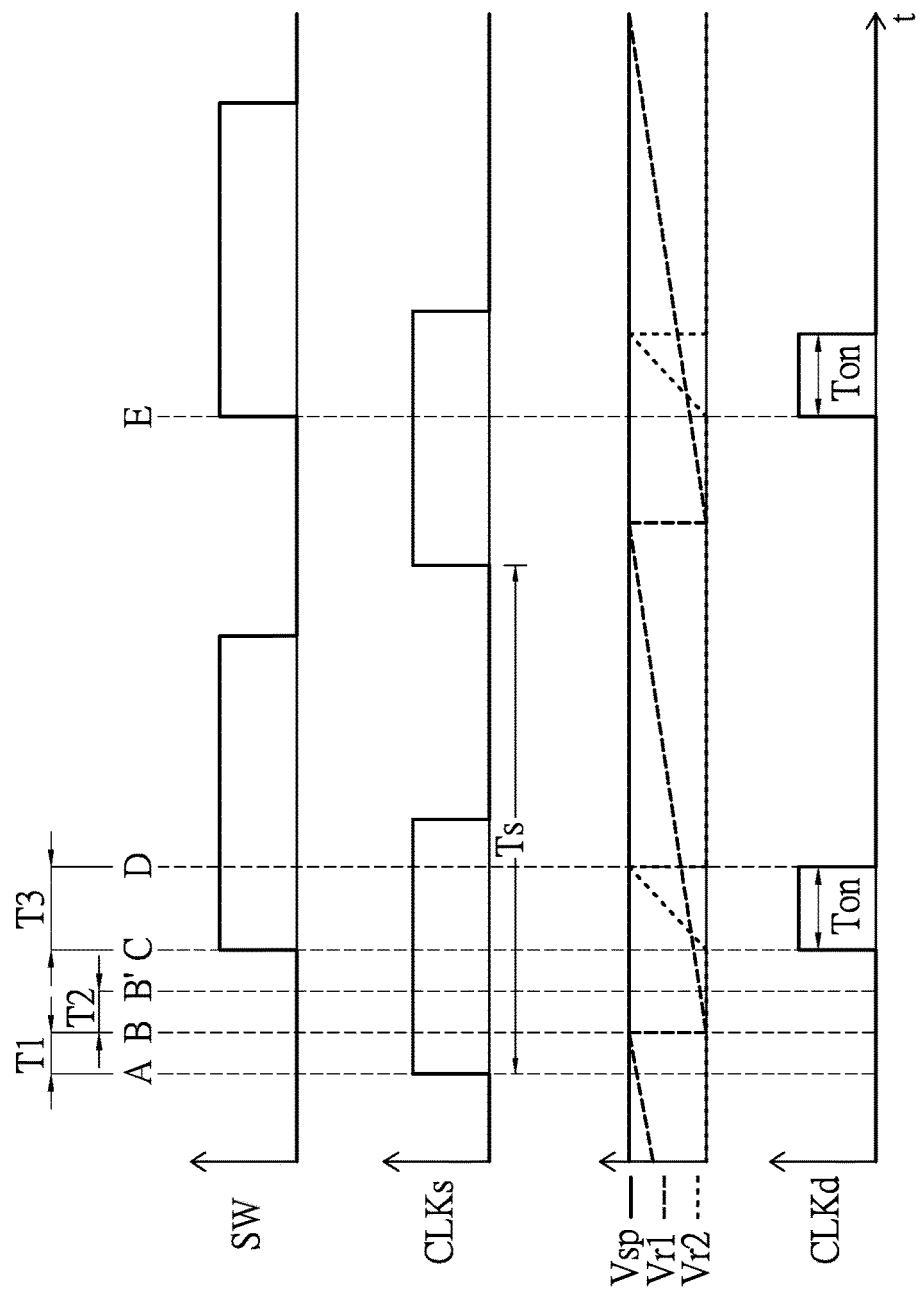
FIG. 4A shows a waveform of a switching converter according to an embodiment of the present disclosure.

Referring to FIGS. 2, 3, and 4A, FIG. 3 shows a schematic diagram of a clock synchronization circuit according to an embodiment of the present disclosure and FIG. 4A shows a waveform of a switching converter according to an embodiment of the present disclosure. The clock synchronization circuit 130 connects to the decision circuit 120 and the pulse generator 140 and receives the constant clock signal CLKs, the switch signal SW, the input voltage Vin, and the output voltage Vout to generate a synchronization signal CLKd. In the present disclosure, the constant clock signal CLKs can be generated by an external electronic element (e.g., quartz oscillators) or by an internal clock generator. The present disclosure is not limited thereto.

As shown in FIG. 3, the clock synchronization circuit 130 includes a first detector 132, a second detector 134, and a signal synchronization generator 136. The first detector 132 is used for generating a first voltage Vr1 related to the output voltage Vout and the period length of the constant clock signal CLKs. The first detector 132 generates a reference voltage Vsp according to the first voltage Vr1. The second detector 134 generates a second voltage Vr2 related to the input voltage Vin.

The signal synchronization generator 136 connects to the first detector 132 and the second detector 134 The signal synchronization generator 136 compares the reference voltage Vsp with the second voltage Vr2 to generate the synchronization signal CLKd. How the clock synchronization circuit 130 generates the synchronization signal CLKd and the synchronization signal CLKd synchronizes the period length of the constant clock signal CLKs and the duty cycle of the switching converter 100 will be described accompanying with FIG. 4A as follows.

As shown in FIG. 4A, when the first detector 132 receives the constant clock signal CLKs indicating the positive-edge trigger, the reference voltage Vsp is a high level. The first voltage Vr1 is converted from the high level into the low level and then increases. The second voltage Vr2 is the low level. More specifically, when the constant clock signal CLKs is the positive-edge trigger, the first detector 132 controls the first voltage Vr1 to synchronize the reference voltage Vsp for a first predefined time T1 (i.e., the time interval from the time point A to the time point B). After the first predefined time T1, the first detector 132 controls the first voltage Vr1 to convert the high level into the low level for a second predefined time T2 (i.e., the time interval from the time point B to the time point B') and then increases the first voltage Vr1. After the constant clock signal CLKs is the positive-edge trigger and before the switch signal is the positive-edge trigger (i.e., the time interval from the time point B' to the time point C), the first detector 132 controls the second voltage Vr2 to be the low level.

After the constant clock signal CLKs is the positive-edge trigger, when the switch signal SW is the positive-edge trigger (i.e., the time point C), the signal synchronization generator 136 controls the synchronization signal CLKd to be converted from the low level into the high level. The first detector 132 controls the reference voltage Vsp to be the high level and increases the first voltage Vr1. The second detector 134 increases the second voltage Vr2 from the low level. During the third predefined time T3, the signal synchronizing generator 136 controls the second voltage Vr2 to continuously increase according to the switch signal SW. When the second voltage increases to be higher than the reference voltage Vsp (i.e., the time point D), the signal synchronization generator 136 controls the synchronization signal CLKd to be converted from the high level into the low level. The second detector 134 controls the second voltage Vr2 to be converted from the high level into the low level until the signal synchronization generator 136 receives the next positive-edge trigger of the switch signal SW (i.e., the time point E). In the present disclosure, the period length Ts of the constant clock signal CLKs is much longer than the first predefined time T1 and the second predefined time T2 (i.e., the first predefined time T1 and the second predefined time T2 are very short time) to conform to a better synchronization condition.

From the aforementioned exemplary embodiments it can be realized that the clock synchronization circuit 130 will generate the synchronization signal CLKd according to the relationship among the constant clock signal CLKs, the switch signal SW, the first voltage Vr1 (related to the output voltage Vout), the second voltage Vr2 (related to the input voltage Vin), and the reference voltage Vsp (related to the output voltage Vout). The synchronization signal CLKd synchronizes the period length Ts of the constant clock signal CLKs and generates the constant on-time Ton according to the synchronization signal CLKd, thereby acquiring the period length of the synchronization signal CLKd and the duty cycle of the switching converter 100.

The first detector 132, the second detector 134, and the signal synchronization generator 136 are further described in the following exemplary embodiments. As shown in FIG. 3, the first detector 132 includes a first current source I1, a first capacitor Cr1, a first switch Sw1, a reference switch Swr, and a reference capacitor Csp. The first current source I1 is related to the output voltage Vout. In the present disclosure, the first current source I1=(A1*the output voltage Vout) and A1 is a weight value. One end of the first capacitor Cr1 connects to the first current source I1 and the other end of the first capacitor Cr1 connects to ground. An end of the first switch Sw1 connects to a first end P1 between the first current source I1 and the first capacitor Cr1 and the other end of the first switch Sw1 connects to ground. The reference switch Swr connects between the first end P1 and the signal synchronization generator 136. An end of the reference capacitor Csp connects to a reference end Pr between the reference switch Swr and the signal synchronization generator 136 and the other end of the reference capacitor Csp connects to ground.

More specifically, the first switch Sw1 is controlled by a first signal S1. The reference switch Swr is controlled by a reference signal Sr. For example, when the first signal S1 is the high level, the first switch Sw1 is turned on. Conversely, when the first signal S1 is the low level, the first switch Sw1 is turned off. The reference signal Sr is controlled by the same logical method, so detailed description is omitted. In the present disclosure, the first signal S1 and the reference signal Sr are controlled by a switch controller of the clock synchronization circuit 130 (not shown in FIGs). The switch controller receives the constant clock signal CLKs and generates the first signal S1 and the reference signal Sr according to the constant clock signal CLKs to respectively control the turn-on and turn-off of the first switch Sw1 and the reference switch Swr. The first signal S1 and the reference signal Sr can be controlled by other controllers. The present disclosure is not limited thereto.

The second detector 134 includes a second current source I2, a second capacitor Cr2, and a second switch Sw2. The second current source I2 is related to the input voltage Vin. In the present disclosure, the second current source I2= (A2*the input voltage Vin) and A2 is a weight value. An end of the second capacitor Cr2 connects to a second end P2 between the second current source I2 and the signal synchronization generator 136 and the other end of the second capacitor Cr2 connects to ground. An end of the second switch Sw2 connects to the second end P2 and the other end of the second switch Sw2 connects to ground.

The signal synchronization generator 136 includes a comparator 136A and an on-time generator 136B. The comparator 136A has a positive input end, a negative input end, and an output end. The positive input end receives the second voltage Vr2. The negative input end receives the reference voltage Vsp. The comparator 136A compares the second voltage Vr2 with the reference voltage Vsp to generate a reset signal Rst to the on-time generator 136B. The on-time generator 136B connects to the comparator 136A and receives the switch signal SW and the reset signal Rst.

In the present disclosure, the on-time generator 136B is SR-latch. In the SR-latch, there are a set end S, a reset end R, an output end Q, and an inverse output end Q'. The set end S receives the switch signal SW. The reset end R receives the reset signal Rst. The output end Q outputs the synchronization signal CLKd. The inverse output end Q' outputs the second signal S2 (i.e., the inverse synchronization signal CLKd). The turn-on and turn-off of the second switch Sw2 are controlled by the second signal S2. Certainly, the second switch Sw2 can be controlled by other methods. For example, the second switch Sw2 is controlled by the switch controller of the clock synchronization circuit 130 (not shown in FIGs). The switch controller controls the turn-on and turn-off of the second switch Sw2 according to the result of the reset signal Rst. The present disclosure is not limited thereto.

Figure 4B:
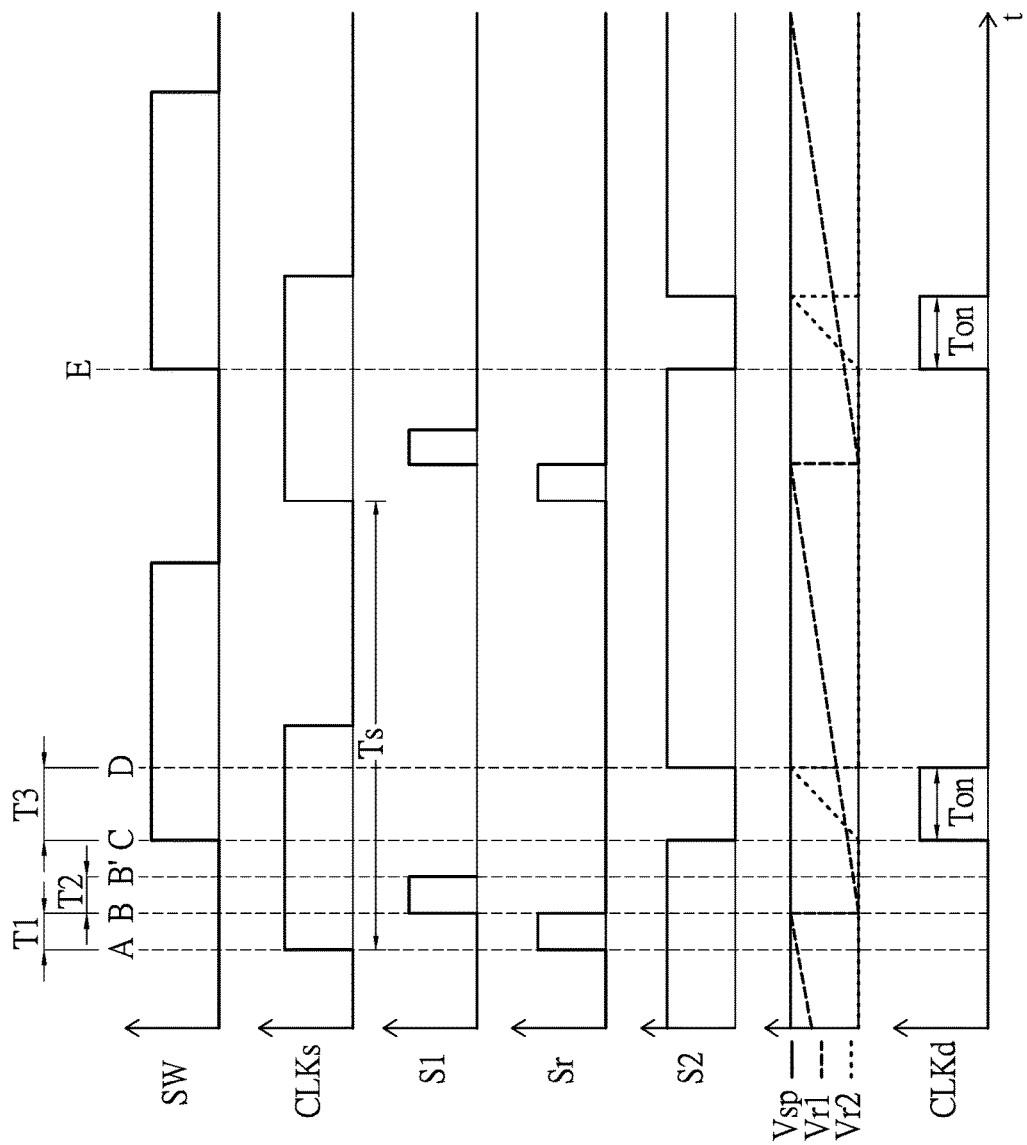
FIG. 4B shows another waveform of a switching converter according to an embodiment of the present disclosure.

Reference is made to FIG. 4B, which shows a waveform generated from the architecture of the first detector 132, the second detector 134, and the signal synchronization generator 136 in the present disclosure. As shown in FIG. 4B, when the constant clock signal CLKs is the positive-edge trigger (e.g., the time point A), the first signal S1 is the low level. The reference signal Sr synchronizes the high level for the first predefined time T1 (e.g., the time interval from the time point A to the time point B). At this time, when the positive-edge trigger of the switch signal SW does not occur, the second signal maintains the high level. During the first predefined time T1, the first switch Sw1 is turned off according to the first signal S1 with the low level, the reference switch Swr is turned on according to the reference signal Sr with the high level and the second Sw2 is turned on according to the second signal S2 with the high level. Therefore, the first current source I1 charges the first capacitor Cr1 and the reference capacitor Csp and the second capacitor Cr2 is discharged to ground, so that the first voltage Vr1 synchronizes the reference voltage Vsp to generate the first voltage Vr1 with the high level, the reference voltage Vsp with the high level, and the second voltage Vr2 with the low level.

After the first predefined time T1 (i.e., the time point B), the first signal S1 is converted from the low level into the high level and maintains the high level for the second predefined time T2 (e.g., the time interval from the time point B to the time point B'). The reference signal Sr is the low level. At this time, when the positive-edge trigger of the switch signal SW does not occur, the second signal S2 maintains the high level. During the second predefined time T2, the first switch Sw1 is turned on according to the first signal S1 with the high level, the reference switch Swr is turned off according to the reference signal Sr with the low level and the second switch Sw2 is turned on according to the second signal S2 with the high level. Therefore, the first capacitor Cr1 and the second capacitor Cr2 are discharged to ground, so that the first voltage Vr1 and the second voltage Vr2 are the low level and the reference voltage Vsp maintains the high level.

After the second predefined time T2, the first signal S1 is the low level and the reference signal Sr is the low level, so that the first switch Sw1 and the reference switch Swr are turned off. More specifically, after the second predefined time T2 and before the switch signal SW is the positive-edge trigger, the first signal S1 is converted from the high level into the low level and the reference signal Sr maintains the low-level. The second signal S2 maintains the high level. Therefore, the first switch Sw1 is turned off according to the first signal S1 with the low level, the reference switch Swr is turned off according to the reference signal Sr with the low level, and the second switch Sw2 is turned on according to the second signal S2 with the high level. At this time, the first current source I1 charges the first capacitor Cr1 again, so that the first voltage Vr1 increases from the low level. The reference voltage Sr maintains the high level and the second voltage Vr2 maintains the low level.

When the positive-edge trigger of the switch signal SW occurs (e.g., the time point C), the on-time generator 136B starts the setting process to convert the synchronization signal CLKd from the low level into the high level. The second switch SW2 is turned off according to the inverse synchronization signal CLKd (i.e., the second signal S2 with the low level). At this time, the second current source I2 charges the second capacitor Cr2, so that the second voltage Vr2 increases from the low level.

As time goes on, the second voltage Vr2 increases gradually (e.g., the third predefined time T3). When the second voltage Vr2 increases to be higher than the reference voltage Vsp (e.g., the time point D), the comparator 136A generates the reset signal Rst with the high level to the on-time generator 136B, thereby generating the synchronization signal CLKd converted from the high level into the low level, i.e., generating the constant on-time Ton. At this time, the first switch Sw1 is turned off according to the first signal S1 with the low level. The reference switch Swr is turned off according to the reference signal Sr with the low level. The second switch SW2 is turned on according to the second signal S2 with the high level (i.e, the inverse synchronization signal CLKd). Therefore, the first current source I1 charges the first capacitor Cr1, so that the first voltage Vr1 keeps increasing. The reference voltage Vsp is the high level. The second capacitor Cr2 is discharged to ground, so that the second voltage Vr2 is the low level.

Until the next positive-edge trigger of the switch signal SW occurs (e.g., the time point E), the first detector 132, the second detector 134, and the signal synchronization generator 136 will perform the operation of generating the constant on-time Ton again.

From the aforementioned exemplary embodiments it can be realized that the clock synchronization circuit 130 will generate the synchronization signal CLKd according to the relationship among the constant clock signal CLKs, the switch signal SW, the first voltage Vr1 (related to the output voltage Vout), the second voltage Vr2 (related to the input voltage Vin), and the reference voltage Vsp (related to the output voltage Vout). The synchronization signal CLKd synchronizes the period length Ts of the constant clock signal CLKs to generate the constant on-time Ton. The present disclosure does not limit the detailed elements of the first detector 132, the second detector 134, and the signal synchronization generator 136, and they can also be implemented by other combination elements.

In summary, the present disclosure provides the constant on-time switching converter and the clock synchronization circuit, which can generate the synchronization signal according to the constant clock signal, the switch signal, the input voltage, and the output voltage. The synchronization signal will synchronize the period length of the constant clock signal, thereby generating the duty cycle of the switching converter. People in the business can accordingly avoid the interference with the synchronization signal and other major clock signals, to prevent EMI generation.

The above-mentioned descriptions represent merely the exemplary embodiment of the present disclosure, without any intention to limit the scope of the present disclosure thereto. Various equivalent changes, alterations or modifications based on the claims of present disclosure are all consequently viewed as being embraced by the scope of the present disclosure.

What is claimed is:

1. A constant on-time switching converter comprising:
   an output-stage circuit configured for converting an input voltage into an output voltage according to a constant on-time and configured for generating a feedback voltage according to the output voltage;
a decision circuit connected to the output-stage circuit and configured for generating a switch signal;
a clock synchronization circuit connected to the decision circuit and configured for receiving a constant clock signal, the switch signal, the input voltage and the output voltage, wherein the clock synchronization circuit includes:
a first detector configured for generating a first voltage with a period length related to the output voltage and the constant clock signal and generating a reference voltage according to the first voltage;
a second detector configured for generating a second voltage related to the input voltage; and
a signal synchronization generator connected to the first detector and the second detector and configured for comparing the reference voltage with the second voltage to generate a synchronization signal, wherein the synchronization signal synchronizes the period length of the constant clock signal; and
a pulse generator connected between the clock synchronization circuit and the output-stage circuit and configured for generating the constant on-time according to the synchronization signal;
wherein after the constant clock signal is at a positive-edge trigger, the reference voltage is at a high level, the first voltage is converted from the high level into a low level and then increases, and the second voltage is at the low level;
wherein after the constant clock signal is at the positive-edge trigger, when the switch signal is at a positive-edge trigger, the synchronization signal is converted from the low level into the high level, the reference voltage is at the high level, the first voltage increases and the second voltage increases from the low level, and when the second voltage increases to be higher than the reference voltage, the synchronization signal is converted from the high level into the low level and the second voltage is converted from the high level into the low level until a next positive-edge trigger of the switch signal occurs.

2. The constant on-time switching converter according to claim 1, wherein when the constant clock signal is at the positive-edge trigger and then the first voltage synchronizes the reference voltage for a first predefined time, the first voltage is converted from the high level into the low level for a second predefined time and then increases.

3. The constant on-time switching converter according to claim 1, wherein before the switch signal is at the positive-edge trigger, the second voltage is at the low level.

4. The constant on-time switching converter according to claim 1, wherein the period length of the constant clock signal is longer than the first predefined time and the second predefined time.

5. The constant on-time switching converter according to claim 1, wherein the signal synchronization generator comprises:
a comparator having a positive input end, a negative input end, and an output end, wherein the positive input end receives the second voltage, the negative input end receives the reference voltage, and the comparator compares the second voltage with the reference voltage to generate a reset signal; and
an on-time generator connected to the comparator and configured for receiving the switch signal and the reset signal;
wherein when the switch signal is at the positive-edge trigger, the on-time generator generates the synchronization signal converted from the low level into the high level and when the second voltage is higher than the reference voltage, the on-time generator generates the synchronization signal converted from the high level into the low level.

6. The constant on-time switching converter according to claim 1, wherein the first detector comprises:
a first current source related to the output voltage;
a first capacitor, an end of the first capacitor connected to the first current source and the other end of the first capacitor connected to ground;
a first switch, an end of the first switch connected to a first end between the first current source and the first capacitor and the other end of the first switch connected to ground;
a reference switch connected between the first end and the signal synchronization generator; and
a reference capacitor, an end of the reference capacitor connected to a reference end between the reference switch and the signal synchronization generator and the other end connected to ground;
wherein when the constant clock signal is at the positive-edge trigger, the first switch is turned off for the first predefined time and the reference switch is turned on for the first predefined time;
wherein after the first predefined time, the first switch is turned on for the second predefined time and the reference switch is turned off for the second predefined time;
wherein after the second predefined time, the first switch is turned off and the reference switch is turned off.

7. The constant on-time switching converter according to claim 6, wherein the clock synchronization generator comprises a switch controller, the switch controller receives the clock signal and controls the turn-on and turn-off of the first switch and the turn-on and turn-off of the reference switch according to the clock signal.

8. The constant on-time switching converter according to claim 1, wherein the second detector comprises:
a second current source related to the input voltage;
a second capacitor, an end of the second capacitor connected to a second end between the second current source and the signal synchronization generator and the other end of the second capacitor connected to ground; and
a second switch, an end of the second switch connected to the second end and the other end of the second switch connected to ground;
wherein when the signal synchronization generator receives the switch signal indicating the positive-edge trigger, the second switch is turned off;
wherein when the second voltage is higher than the reference voltage, the second switch is turned on.

9. The constant on-time switching converter according to claim 8, wherein the turn-on and turn-off of the second switch are controlled by an inverse synchronization signal.

10. The constant on-time switching converter according to claim 6, wherein the second detector comprises:
a second current source related to the input voltage;
a second capacitor, an end of the second capacitor connected to a second end between the second current source and the signal synchronization generator and the other end of the second capacitor connected to ground; and a second switch, an end of the second switch connected to the second end and the other end of the second switch connected to ground;

wherein when the signal synchronization generator receives the switch signal indicating the positive-edge trigger, the second switch is turned off;

wherein when the second voltage is higher than the reference voltage, the second switch is turned on.

11. The constant on-time switching converter according to claim 10, wherein the turn-on and turn-off of the second switch are controlled by an inverse synchronization signal.

12. A clock synchronization generator adapted for a switching converter, the switching converter converting an input voltage into an output voltage according to a constant on-time, wherein the constant on-time is generated according to a synchronization signal, the synchronization signal is related to a switch signal generated from a feedback voltage of the output voltage, the input voltage, the output voltage, and a constant clock signal, and the clock synchronization circuit comprises:

a first detector configured for generating a first voltage with a period length related to the output voltage and the constant clock signal and generating a reference voltage according to the first voltage;

a second detector configured for generating a second voltage related to the input voltage; and a signal synchronization generator connected to the first detector and the second detector and configured for comparing the reference voltage with the second voltage to generate the synchronization signal, wherein the synchronization signal synchronizes the period length of the constant clock signal;

wherein after the constant clock signal is at a positive-edge trigger, the reference voltage is at a high level, the first voltage is converted from the high level into a low level and then increases, and the second voltage is at the low level;

wherein after the constant clock signal is at the positive-edge trigger, when the switch signal is at a positive-edge trigger, the synchronization signal is converted from the low level into the high level, the reference voltage is at the high level, the first voltage increases and the second voltage increases from the low level, and when the second voltage increases to be higher than the reference voltage, the synchronization signal is converted from the high level into the low level and the second voltage is converted from the high level into the low level until a next positive-edge trigger of the switch signal occurs.

* * * * *